(12) United States Patent
Bayer et al.

(10) Patent No.: US 12,184,178 B2
(45) Date of Patent: *Dec. 31, 2024

(54) 4-PHASE BUCK-BOOST CONVERTER

(71) Applicant: TEXAS INSTRUMENTS INCORPORATED, Dallas, TX (US)

(72) Inventors: Johann Erich Bayer, Freising (DE); Rüdiger Ganz, Freising (DE); Ivan Shumkov, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,602

(22) Filed: May 3, 2023

(65) Prior Publication Data

US 2023/0275512 A1    Aug. 31, 2023

Related U.S. Application Data

(63) Continuation of application No. 16/992,612, filed on Aug. 13, 2020, now Pat. No. 11,682,971.

(60) Provisional application No. 62/903,460, filed on Sep. 20, 2019.

(51) Int. Cl.
  *H02M 3/158* (2006.01)
  *H02M 1/00* (2006.01)
  *H02M 3/157* (2006.01)

(52) U.S. Cl.
  CPC ....... *H02M 3/1582* (2013.01); *H02M 1/0032* (2021.05); *H02M 1/0009* (2021.05); *H02M 1/0012* (2021.05); *H02M 3/157* (2013.01)

(58) Field of Classification Search
  CPC .......................... H02M 3/1582; H02M 1/0032
  See application file for complete search history.

(56) References Cited

U.S. PATENT DOCUMENTS

| | | |
|---|---|---|
| 6,087,816 A | 7/2000 | Volk |
| 7,723,865 B2 | 5/2010 | Kitanaka |
| 9,859,801 B2 | 2/2018 | Wangemann et al. |

(Continued)

OTHER PUBLICATIONS

International Search Report for PCT/US2020/051730 mailed Dec. 3, 2020.

(Continued)

*Primary Examiner* — Alex Torres-Rivera
(74) *Attorney, Agent, or Firm* — Ray A. King; Frank D. Cimino

(57) ABSTRACT

A system has an input and an output. The system includes a voltage converter, including first transistor coupled to the input and to a first switching node, second transistor coupled to the first switching node and to ground, third transistor coupled to a second switching node and to the output, fourth transistor coupled to the second switching node and to ground, and an inductor having a first terminal coupled to the first switching node and a second terminal coupled to the second switching node. The system also includes a controller coupled to the voltage converter, the controller including a state machine and a plurality of drivers to control the transistors of the voltage converter. The state machine is adaptable to cause the second and fourth transistors to conduct and the first and third transistors not to conduct, in response to current through the inductor being less than a current threshold.

7 Claims, 10 Drawing Sheets

(56) References Cited

U.S. PATENT DOCUMENTS

| | | | |
|---|---|---|---|
| 10,014,777 B1 | | 3/2018 | Shumkov et al. |
| 10,243,463 B2 | | 3/2019 | Sun et al. |
| 10,804,803 B1 | * | 10/2020 | Couleur .............. H02M 3/1584 |
| 2004/0085048 A1 | | 5/2004 | Tateishi |
| 2005/0206354 A1 | | 9/2005 | Ikezawa |
| 2006/0273768 A1 | | 12/2006 | Chen |
| 2008/0055946 A1 | | 3/2008 | Lesso |
| 2008/0272748 A1 | | 11/2008 | Melanson |
| 2015/0229215 A1 | | 8/2015 | Choudhary |
| 2016/0365790 A1 | | 12/2016 | Ye et al. |
| 2017/0257031 A1 | | 9/2017 | Shao |
| 2018/0166990 A1 | | 6/2018 | Gibson |
| 2018/0175726 A1 | | 6/2018 | Petersen et al. |
| 2019/0131877 A1 | | 5/2019 | Luff |
| 2020/0076306 A1 | | 3/2020 | Pullen |
| 2020/0099294 A1 | * | 3/2020 | Chard ................... H02M 3/158 |

OTHER PUBLICATIONS

Extended European Search Report; Application No./Patent No. 20865152.1-1202/4032177 PCT/US2020051730; dated Oct. 12, 2022; 9 pages.

Stefan Waffler et al: "A Novel Low-Loss Modulation Strategy for High-Power Bidirectional Buck Boost Converters", IEEE Transactions on Power Electronics, Institute of Electrical and Electronics Engineers, USA, vol. 24, No. 6, Jun. 1, 2009 (Jun. 1, 2009), pp. 1589-1599, XP011262259, ISSN: 0885-8993.

* cited by examiner

4-PHASE BUCK-BOOST CONVERTER

CROSS-REFERENCE TO RELATED APPLICATIONS

The present application is a continuation of U.S. patent application Ser. No. 16/992,612 filed on Aug. 13, 2020, which claims priority to U.S. Provisional Patent Application No. 62/903,460, which was filed Sep. 20, 2019, is titled "4-Phase Non-Inverting Buck-Boost Converter," and all are hereby incorporated herein by reference in their entirety.

SUMMARY

In accordance with at least one example of the disclosure, a system has an input terminal and an output terminal. The system includes a voltage converter, including a first transistor coupled to the input terminal and to a first switching node, a second transistor coupled to the first switching node and to ground, a third transistor coupled to a second switching node and to the output terminal, a fourth transistor coupled to the second switching node and to ground, and an inductor having a first terminal coupled to the first switching node and a second terminal coupled to the second switching node. The system also includes a controller coupled to the voltage converter, the controller including a state machine and a plurality of drivers to control the transistors of the voltage converter. The state machine is adaptable to cause the second and fourth transistors to conduct and the first and third transistors not to conduct, in response to current through the inductor being less than a current threshold.

In accordance with another example of the disclosure, a controller is for a voltage converter having a first switching node, a second switching node and an inductor coupled between the first and second switching nodes. The controller includes a state machine and a plurality of drivers, each driver coupled to a transistor. The state machine, in response to a current through the inductor being less than a first current threshold, is adaptable to transition to a state in which: a first transistor between the first switching node and an input terminal is not conducting; a second transistor between the first switching node and a ground node is conducting; a third transistor between the second switching node and an output terminal is not conducting; and a fourth transistor between the second switching node and the ground node is conducting.

In accordance with yet another example of the disclosure, a method for controlling a voltage converter includes detecting, by a controller, a current through an inductor coupled to a first switching node and to a second switching node of the voltage converter. The method also includes, in response to the current through the inductor being less than a current threshold, the controller causing a first transistor between the first switching node and an input terminal not to conduct, the controller causing a second transistor between the first switching node and a ground node to conduct, the controller causing a third transistor between the second switching node and an output terminal not to conduct, and the controller causing a fourth transistor between the second switching node and the ground node to conduct.

BRIEF DESCRIPTION OF THE DRAWINGS

For a detailed description of various examples, reference will now be made to the accompanying drawings in which.

DETAILED DESCRIPTION

Figure 1:
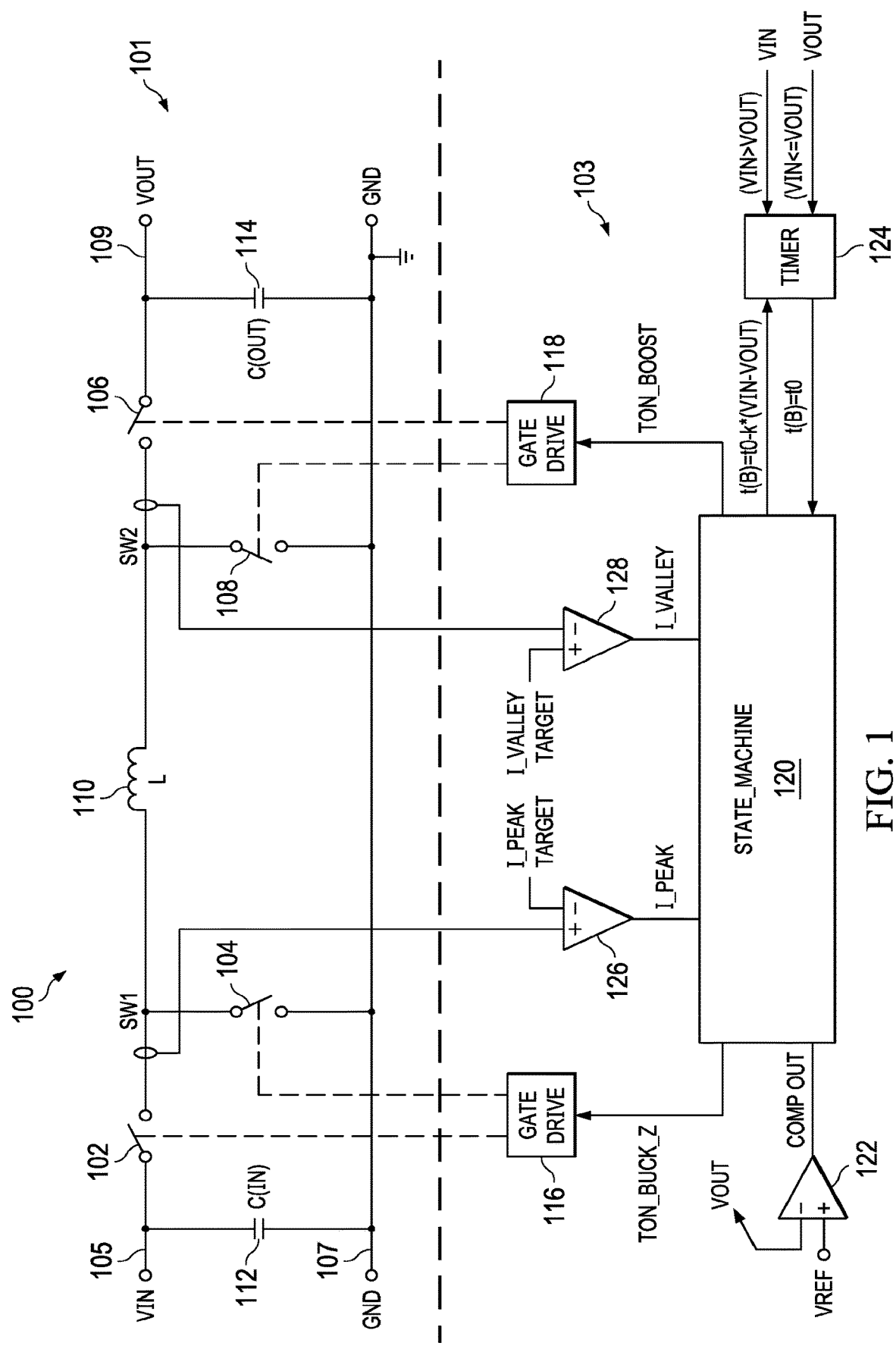
FIG. 1 shows a schematic diagram of a voltage converter and a controller in accordance with various examples.

Direct current (DC)-DC converters may be implemented as switched mode power supplies (SMPS). DC converters may be used in a variety of circuits to provide a DC output signal by converting a DC input signal. For example, DC converters may be used in systems in which power is supplied by a battery to a load, particularly where the battery voltage may change over time (e.g., as the battery is depleted). Examples of such systems include automotive applications, personal electronic devices, Internet of Things (IoT)-connected devices, or other battery-powered applications. The input and output signals can have similar or opposite polarities. SMPS converters include buck, boost, buck-boost, and other types. Buck DC-DC converters are operable to provide output voltages (VOUT) equal to or below the voltage of the input signal (VIN). Boost converters are operable to provide VOUT that is greater than or equal to VIN. Buck-boost converters provide the functionality of a buck converter and a boost converter. Buck-boost converters include one or more inductors. The series inductor is energized by the input signal and is subsequently de-energized to provide the output signal.

An issue with buck-boost converters occurs when VOUT is approximately equal to VIN, referred to as the buck-boost transfer region. In the buck-boost transfer region, buck-boost converters suffer from regulation issues related to toggling between buck mode and boost mode, which results in glitches such as sub-harmonic oscillations on VOUT. In particular, buck-boost converters have different transfer functions for operation in buck mode (VOUT<VIN) and boost mode (VOUT>VIN). The buck mode transfer function is given by VOUT=VIN*D(buck), where D(buck) is a duty cycle value for buck mode operation in the range of 0 to 1. The boost mode transfer function is given by VOUT=VIN/(1−D(boost)), where D(boost) is a duty cycle value for boost mode operation in the range of 0 to 1. Thus, in the buck-boost mode of operation, where VOUT=VIN, the buck mode duty cycle, D(buck), is close to 1 and the boost mode duty cycle, D(boost), is close to 0. However, due to minimum on- and off-times, D(buck) can approach the value of 1 (but may not be able to reach it) and D(boost) can approach the value of 0 (but may not be able to reach it). This condition leads to the regulation issues, including sub-harmonic oscillations on VOUT, because the transfer function is not defined in this region.

Regulation bandwidth of a voltage converter refers to the response time of a control loop for the voltage converter to a change in an input condition (e.g., load current) for the control loop. A greater regulation bandwidth results in a shorter response time to a change in the input condition and a lesser regulation bandwidth results in a longer response time to a change in the input condition. In boost mode, the regulation bandwidth of buck-boost converters is limited by the right-half-plane (RHP) zero frequency. The RHP zero frequency limits regulation bandwidth because the RHP zero acts as a pole that provides gain boosting in the feedback path. As a result, the regulation bandwidth should be, for example, three to five times lower than the RHP zero frequency to avoid oscillation. The limitation on regulation bandwidth by the RHP zero frequency results in a diminished transient response in boost mode because the control loop reacts more slowly to changes in the input condition (e.g., load current) to regulate VOUT of the voltage converter.

Example embodiments (which include a controller) address the foregoing issues for a voltage converter, such as a buck-boost, DC-DC voltage converter. In an example, the controller includes a state machine configured to control transistors of the voltage converter to operate in a pause phase, in which an inductor of the voltage converter is shorted, allowing energy to be preserved in the voltage converter during the pause phase. Thus, in addition to the inductor being energized by VIN and de-energized to provide VOUT, examples of this disclosure include controlling the voltage converter to include a phase in which energy is preserved in the voltage converter as will be discussed below.

As a result, the transfer of input signal energy to output signal energy by the voltage converter can be regulated by altering the length of the pause phase, in which energy is preserved in the voltage converter. This reduces the above-mentioned problems with regulation in the buck-boost mode of operation, such as sub-harmonic oscillations, by providing a phase of operation for the voltage converter in which the inductor is neither being energized nor de-energized. Additionally, the pause phase allows energy transfer from the voltage converter to a load to be stopped without consequently energizing the inductor, which avoids VOUT overshoots, and thus addresses the above-mentioned RHP zero limitations on bandwidth. These benefits are described more fully below with reference to various examples and the accompanying figures.

FIG. 1 depicts a system 100 in accordance with various examples. The system 100 includes a voltage converter 101 and a controller 103 coupled to the voltage converter 101. In this example, the voltage converter 101 is a buck-boost converter that converts an input voltage (VIN) at an input terminal 105 to an output voltage (VOUT) at an output terminal 109. The voltage converter 101 is configured to operate in multiple modes (e.g., buck mode, boost mode, or buck-boost mode). The voltage converter 101 includes at least a first switch 102, a second switch 104, a third switch 106, a fourth switch 108, and an inductor 110. In one example, the switches 102, 104, 106, 108 are transistors, such as field-effect transistors (such as n-type or p-type metal-oxide-silicon field-effect transistors, MOSFETs) or bipolar transistors, and are referred to as transistors below. In the example of FIG. 1, the voltage converter 101 also includes an input capacitor 112 and an output capacitor 114.

In particular, the input capacitor 112 is coupled between input terminal 105 and a ground terminal 107. The first transistor 102 is also coupled to the input terminal 105 and a first switching node SW1, while the second transistor 104 is coupled to the first switching node SW1 and to the ground terminal 107. For example, the drain of transistor 102 (if it is a pMOS device) is coupled to input terminal 105 and the source of transistor 102 is coupled to the switching node SW1. Similarly, the drain of transistor 104 (if it is a pMOS device) is coupled to the switching node and the source of transistor 104 is coupled to ground 107. The inductor 110 is coupled to the first switching node SW1 and to a second switching node SW2. In particular, the first switching node SW1 is configured to couple to a first terminal of the inductor 110 and the second switching node SW2 is configured to couple to a second terminal of the inductor 110. The third transistor 106 is coupled to the second switching node SW2 and to the output terminal 109, while the fourth transistor 108 is coupled to the second switching node SW2 and to the ground terminal 107. The output capacitor 114 is coupled between the output terminal 109 and the ground terminal 107.

In the example of FIG. 1, the controller 103 includes at least a state machine 120 that is configured to control gate drivers 116, 118 to control the transistors 102, 104, 106, 108 (e.g., to be conducting or not conducting) of the voltage converter 101 to provide a desired VOUT for a given VIN. The gate drivers 116, 118 may include charge pumps, which are not shown for simplicity. The state machine 120 is coupled to the gates, for example, of first and second transistors 102, 104 by way of the gate driver 116, and is coupled to the gates, for example, of third and fourth transistors 106, 108 by way of the gate driver 118. Although the gate drivers 116, 118 are shown as two separate modules for schematic simplicity, in some examples the functionality of the gate drivers 116, 118 is carried out by more (e.g., one gate driver per transistor) or fewer (e.g., one gate driver for all four transistors) modules. State machine 120 may be implemented, in some example embodiments, as a separate processing unit from controller 103 or part of a larger processing device. State machine 120 (and controller 103) may be implemented, in some example embodiments, using a processor (such as a microprocessor or a microcontroller) or an application-specific-integrated-circuit (ASIC). For simplicity, it is assumed that the state machine 120, through the gate drivers 116, 118, controls or causes the voltage converter 101 to operate in various modes (e.g., buck mode, boost mode, or buck-boost mode) as described in further detail below.

In the example of FIG. 1, the controller 103 also includes a first comparator 122 having an inverting terminal coupled to the output terminal 109 and a non-inverting terminal configured to receive a reference or threshold voltage (VREF). The first comparator 122 thus compares VOUT to VREF and asserts its output (COMP OUT) in response to VOUT being less than VREF. The output of the first comparator 122 is an input to the state machine 120, the function of which is described in further detail below. The controller 103 is thus configured to detect VOUT based on the output of the first comparator 122.

The controller 103 also includes a second comparator 126 having a non-inverting terminal coupled to switching node SW1 and an inverting terminal configured to receive an upper current threshold reference voltage (I_PEAK TARGET). Switching node SW1 is a schematic representation of a node having a voltage that is related to (e.g., proportional to) the current through the inductor 110 (IL), such as a voltage across a current sense resistor (or across one of the transistors that is conducting) in series with the inductor 110, which is not shown in FIG. 1 for simplicity. I_PEAK TARGET is related to (e.g., proportional to) an upper current threshold (I_PEAK), which is described in further detail below. The second comparator 126 thus compares IL to I_PEAK (or voltages proportional to IL and I_PEAK) and asserts its output in response to IL being greater than I_PEAK. The output of the second comparator 126 (I_PEAK) is an input to the state machine 120, the function of which is described in further detail below.

The controller 103 also includes a third comparator 128 having an inverting terminal coupled to switching node SW2 and a non-inverting terminal configured to receive a lower current threshold reference voltage (I_VALLEY TARGET). As above, the switching node SW2 is a schematic representation of a node having a voltage that is related to (e.g., proportional to) IL. I_VALLEY TARGET is related to (e.g., proportional to) a lower current threshold (I_VALLEY), which is described in further detail below. The third comparator 128 thus compares IL to I_VALLEY (or voltages proportional to IL and I_VALLEY) and asserts its output (I_VALLEY) in response to IL being less than I_VALLEY. The output of the third comparator 128 is an input to the state machine 120, the function of which is described in further detail below. The controller 103 is thus configured to detect IL based on the outputs of the comparators 126, 128.

The controller 103 also includes a timer 124 (e.g., a counter) that is coupled to the state machine 120. The state machine 120 supplies an input to the timer 124 (e.g., to start the timer 124 in response to a condition being met). The state machine 120 also receives an input from the timer 124 (e.g., indicating a certain amount of time has elapsed). In some examples, the timer 124 also receives VIN and VOUT as inputs, which are used to determine an amount of time that the timer 124 is configured to indicate. The function of the timer 124 and the state machine 120 are described in further detail below.

FIGS. 2-5 show the voltage converter 101 in various phases of its operation, being controlled by the controller 103 including the state machine 120 described above, in accordance with various examples. As explained further below, operating the voltage converter 101 in the four phases shown in FIGS. 2-5 allows the voltage converter 101 to operate in buck mode, boost mode, or buck-boost mode while reducing the regulation and RHP zero issues described above. Additionally, and as explained further below, a conversion energy of the voltage converter 101 is controlled by the controller 103 regulating the values of I_PEAK and/or I_VALLEY and the length of the various phases, described below. Regardless of whether the voltage converter 101 functions as a buck converter, a boost converter, or a buck-boost converter, the voltage converter 101 is controlled by the state machine 120 to cycle through the various phases described below.

Figure 2:
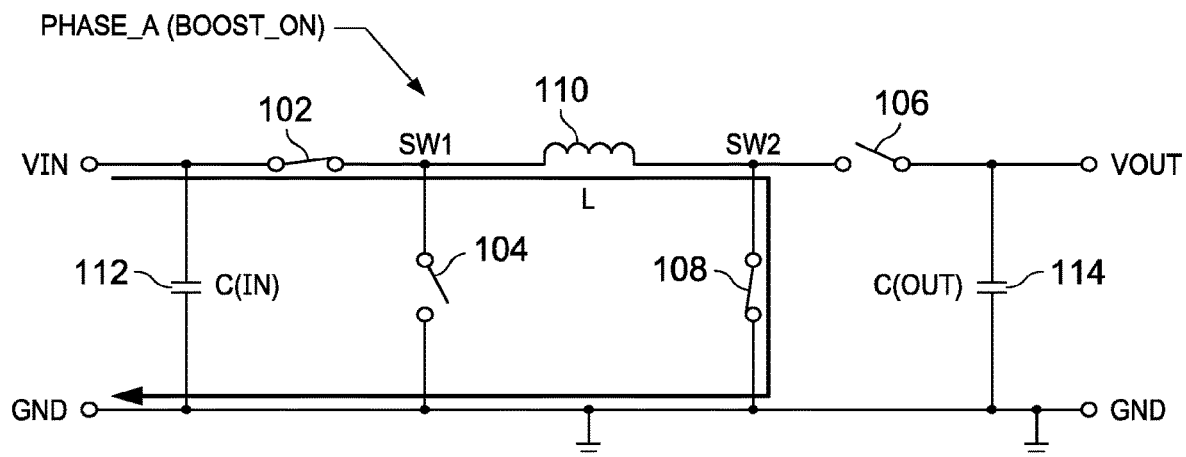
FIG. 2 shows a schematic diagram of the voltage converter in a boost-on phase in accordance with various examples.

In particular, FIG. 2 shows the voltage converter 101 in a boost-on phase. In the boost-on phase, the first transistor 102 and the fourth transistor 108 are conducting, while the second transistor 104 and the third transistor 106 are not conducting. As a result, a current path is formed as shown by the arrow in FIG. 2, and the inductor 110 is energized by VIN. During the boost-on phase, the output capacitor 114 provides energy (stored prior to this phase) to the output signal (e.g., VOUT).

Figure 3:
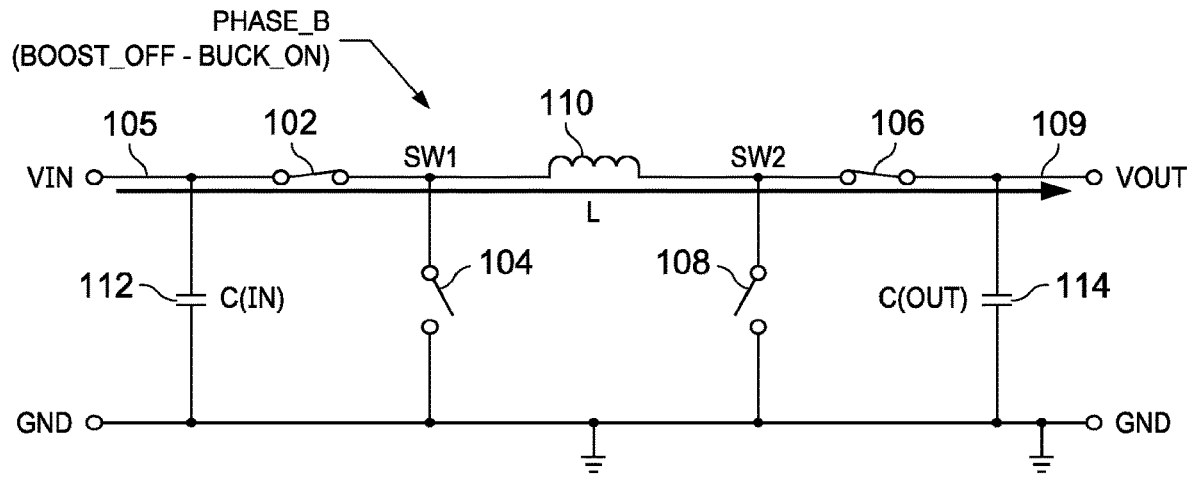
FIG. 3 shows a schematic diagram of the voltage converter in a boost-off, buck-on phase in accordance with various examples.

FIG. 3 shows the voltage converter 101 in a boost-off, buck-on phase. In the boost-off, buck-on phase, the first transistor 102 and the third transistor 106 are conducting, while the second transistor 104 and the fourth transistor 108 are not conducting. As a result, a current path is formed as shown by the arrow in FIG. 3, and the input terminal 105 is coupled to the output terminal 109 by the inductor 110.

Figure 4:
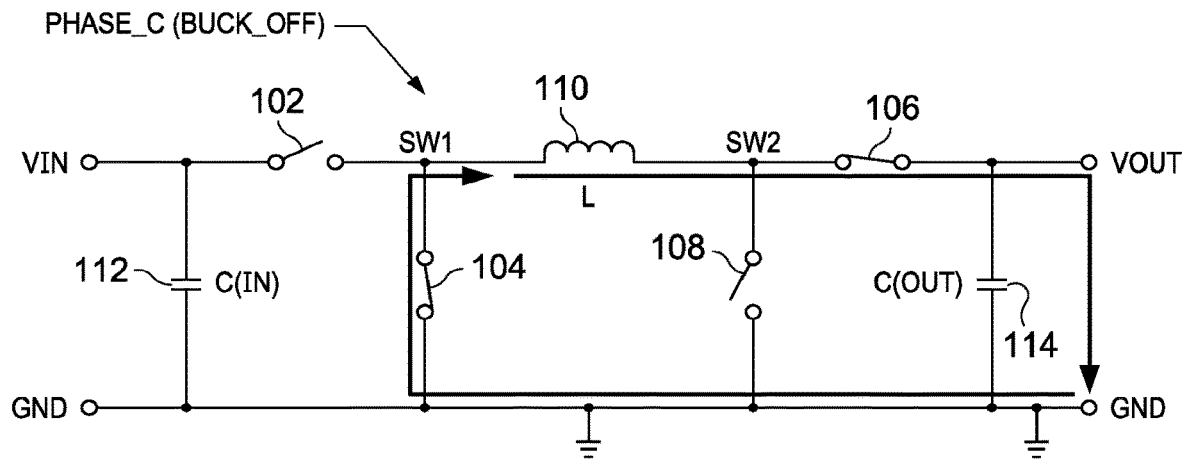
FIG. 4 shows a schematic diagram of the voltage converter in a buck-off phase in accordance with various examples.

FIG. 4 shows the voltage converter 101 in a buck-off phase. In the buck-off phase, the second transistor 104 and the third transistor 106 are conducting, while the first transistor 102 and the fourth transistor 108 are not conducting. As a result, a current path is formed as shown by the arrow in FIG. 4, and the inductor 110 is de-energized by providing energy to the output signal (e.g., VOUT). During the buck-off phase, the input capacitor 112 is charged by the input signal (e.g., VIN).

Figure 5:
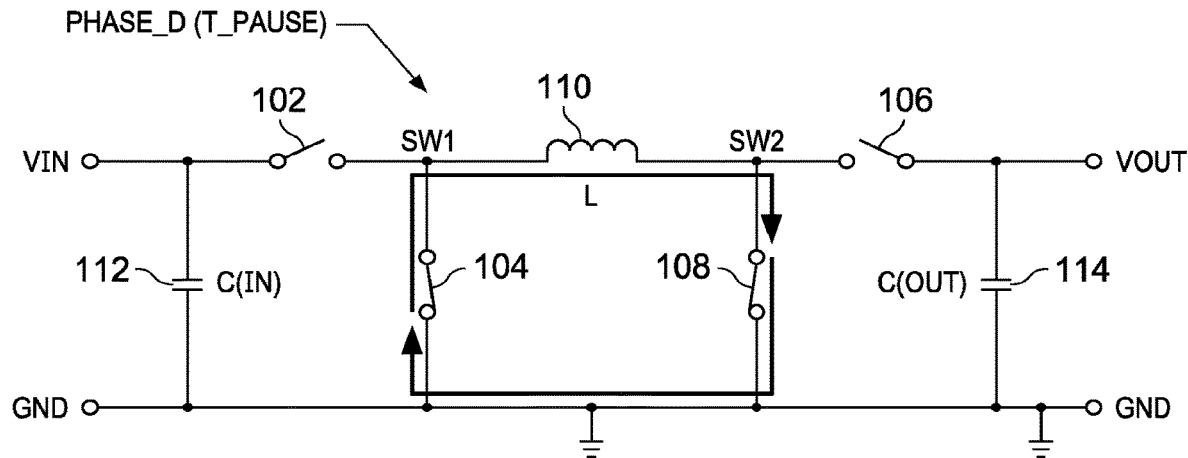
FIG. 5 shows a schematic diagram of the voltage converter in a pause phase in accordance with various examples.

FIG. 5 shows the voltage converter 101 in a pause phase. In the pause phase, the second transistor 104 and the fourth transistor 108 are conducting, while the first transistor 102 and the third transistor 106 are not conducting. As a result, a current path is formed as shown by the arrow in FIG. 5. In the pause phase, energy is preserved in the voltage converter 101 because the inductor 110 is shorted, which results in an approximately constant current through the loop shown in FIG. 5, which decreases slightly according to a time constant of the inductor 110 in combination with resistive losses. As explained further below, in some examples the state machine 120 causes the voltage converter 101 to remain in the pause phase as long as VOUT is greater than a target VOUT threshold voltage. The introduction of the pause phase in examples of this disclosure allows energy flow to VOUT to be decreased while avoiding adding energy to the voltage converter 101 (e.g., by energizing the inductor 110 by VIN, as shown in FIG. 2). As a result, a balance is maintained between the energy delivered to the voltage converter 101 and the energy consumed at the output (e.g., by supplying VOUT) that is independent of the magnitude of VIN and VOUT. As a result, distortions due to regulation activity are reduced. As explained further below, regulation of the voltage converter 101 is achieved through regulating the duration of the pause phase, while the energy supplied by the voltage converter 101 in a pulse (e.g., a single cycle through the above phases of FIGS. 2-5) is determined by I_PEAK, I_VALLEY, and the length of the boost-off, buck-on phase shown in FIG. 3.

Figure 6:
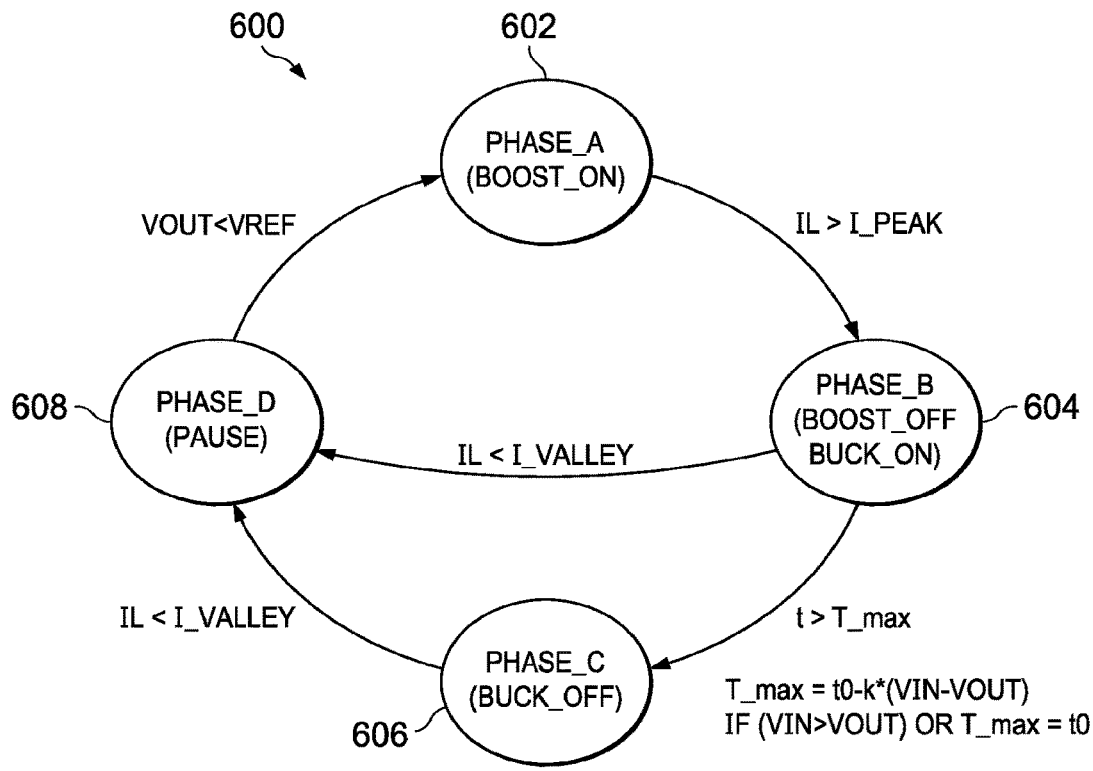
FIG. 6 shows a state diagram of operation of the voltage converter in accordance with various examples.

FIG. 6 shows a state diagram 600 that illustrates the operation of the state machine 120 as the controller 103 for the voltage converter 101, described above. The state diagram 600 includes a state 602 that corresponds to the state machine 120 controlling the voltage converter 101 in the boost-on phase, described above with respect to FIG. 2. The state diagram 600 also includes a state 604 that corresponds to the state machine 120 controlling the voltage converter 101 in the boost-off, buck-on phase, described above with respect to FIG. 3. The state diagram 600 further includes a state 606 that corresponds to the state machine 120 controlling the voltage converter 101 in the buck-off phase, described above with respect to FIG. 4. Finally, the state diagram 600 includes a state 608 that corresponds to the state machine 120 controlling the voltage converter 101 in the pause phase, described above with respect to FIG. 5.

During the state 602, in which the state machine 120 controls the voltage converter 101 in the boost-on phase, the inductor 110 is energized as VIN is applied across the inductor 110, causing the current through the inductor 110 (IL) to increase. As a result of the second comparator 126 detecting that IL is greater than I_PEAK, the second comparator 126 output being asserted causes the state machine 120 to transition to the state 604.

During the state 604, in which the state machine 120 controls the voltage converter 101 in the boost-off, buck-on phase, the inductor is coupled to both the input terminal 105 and the output terminal 109. In examples in which the voltage converter 101 operates in buck mode, in which VOUT is less than VIN, IL continues to increase while the state machine 120 operates in state 604 due to the polarity of the voltage across the inductor 110 remaining similar as in state 602. However, in examples in which the voltage converter 101 operates in boost mode, in which VOUT is greater than VIN, IL begins to decrease while the state machine 120 operates in state 604 due to the polarity of the voltage across the inductor 110 reversing relative to state 602. Similarly, in examples in which the voltage converter 101 operates in buck-boost mode, in which VOUT is approximately equal to VIN, IL also begins to decrease while the state machine 120 operates in state 604 due to real-world impacts of non-ideal circuit behavior, such as resistive losses in both the inductor 110 and the transistors 102, 106.

In response to entering the state 604, the state machine 120 is configured to signal to the timer 124 (e.g., by asserting a signal provided to the timer 124) to begin timing. In response to the voltage converter 101 being operated in buck mode, the timer 124 is configured with a time threshold (e.g., T_max) that is decreased in proportion to the difference between VIN and VOUT (e.g., T_max=t0−k*(VIN−VOUT)). This has the effect of remaining in state 604, in which energy is transferred to the output (e.g., VOUT) from the inductor 110, for less time as the difference between VIN and VOUT increases. This also reduces the inductor 110 ripple current, which would otherwise increase with longer values of T_max and a large voltage across the inductor 110 (e.g., VIN−VOUT). In response to the voltage converter 101 being operated in boost mode or buck-boost mode, the timer 124 is configured with a time threshold, T_max=t0. In these examples, t0 or T_max are values that are related to the switching frequency of the voltage converter 101. The timer 124 output being asserted indicates that the time (t) kept by the timer 124 is greater than T_max. Regardless of the mode of operation of the voltage converter 101 (e.g., boost mode, buck mode, or buck-boost mode), the timer 124 output being asserted causes the state machine 120 to transition to the state 606.

During the state 606, in which the state machine 120 controls the voltage converter 101 in the buck-off phase, the inductor 110 is de-energized by providing energy to the output signal (e.g., VOUT), causing IL to decrease. As a result of the third comparator 128 detecting that IL is less than I_VALLEY, the third comparator 128 output being asserted causes the state machine 120 to transition to the state 608.

During the state 608, in which the state machine 120 controls the voltage converter 101 in the pause phase, the energy is preserved in the voltage converter 101 by shorting the inductor 110. While IL decreases slightly due to the time constant of the inductor 110 and resistive losses across the short circuit path, IL remains relatively stable during the pause phase. As a result of the third comparator 128 detecting that IL is less than I_VALLEY, the third comparator 128 output being asserted causes the state machine 120 to transition to the state 608. The state machine 120 remains in the state 608 until VOUT is less than the reference or threshold voltage (VREF). Thus, the regulation of VOUT is through regulating the duration that the state machine 120 remains in state 608. As a result of the first comparator 122 detecting that VOUT is less than VREF, the first comparator 122 output being asserted causes the state machine 120 to transition back to the state 602.

Additionally, referring back to the state 604, in boost mode and buck-boost mode, IL decreases as explained above. As a result of the third comparator 128 detecting that IL is less than I_VALLEY, the third comparator 128 output being asserted causes the state machine 120 to transition to the state 608. In an example, IL being less than I_VALLEY during the state 604 is an indication that the voltage converter 101 has already provided more energy to the output signal (e.g., VOUT) than desired for a given set of operating parameters. As a result, instead of transitioning first to the state 606, in which the voltage converter 101 provides additional energy to the output signal (e.g., VOUT), the state machine 120 transitions directly to the state 608, in which the voltage converter 101 energy is preserved. Subsequently, the state machine 120 transitions back to state 602 as described above, and energy is again provided to the voltage converter 101 by the input signal (e.g., VIN).

Figure 7:
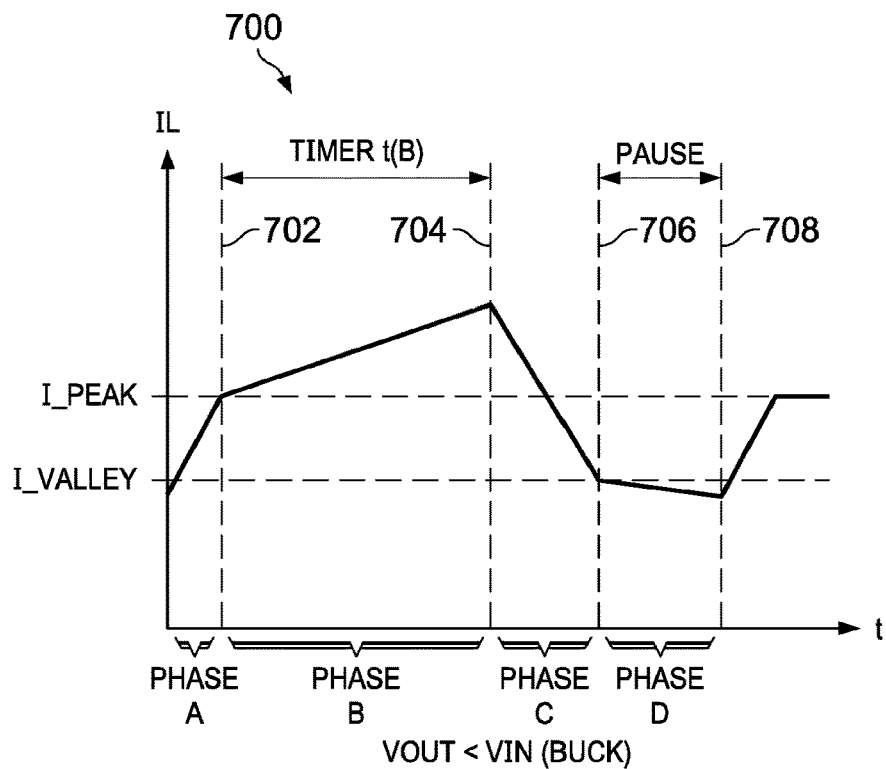
FIG. 7 shows a waveform of inductor current as a function of time for the voltage converter operating in a buck mode in accordance with various examples.

FIG. 7 shows a waveform 700 of IL as a function of time for the voltage converter 101 operating in buck mode (VOUT<VIN) in accordance with various examples. The waveform 700 begins with the state machine 120 operating in state 602 (e.g., boost-on phase) in which IL increases due to VIN being applied across the inductor 110. At time 702, IL reaches I_PEAK, which causes the state machine 120 to transition to state 604 as explained above. In this buck mode example, IL continues to increase, although at a slower rate, due to the voltage across the inductor 110 (VIN−VOUT). At time 704, the timer 124 reaches T_max as explained above, which causes the state machine 120 to transition to state 606. IL thus begins to decrease as the inductor 110 is de-energized by providing energy to the output signal (e.g., VOUT). At time 706, IL reaches I_VALLEY, which causes the state machine 120 to transition to state 608 as explained above. IL decreases slightly as a result of the inductor 110 time constant and resistive losses across the short circuit path, but energy is generally preserved in the voltage converter 101 from time 706 to 708. At time 708, VOUT reaches VREF, which causes the state machine 120 to transition back to state 602, and the described cycle is repeated.

Figure 8:
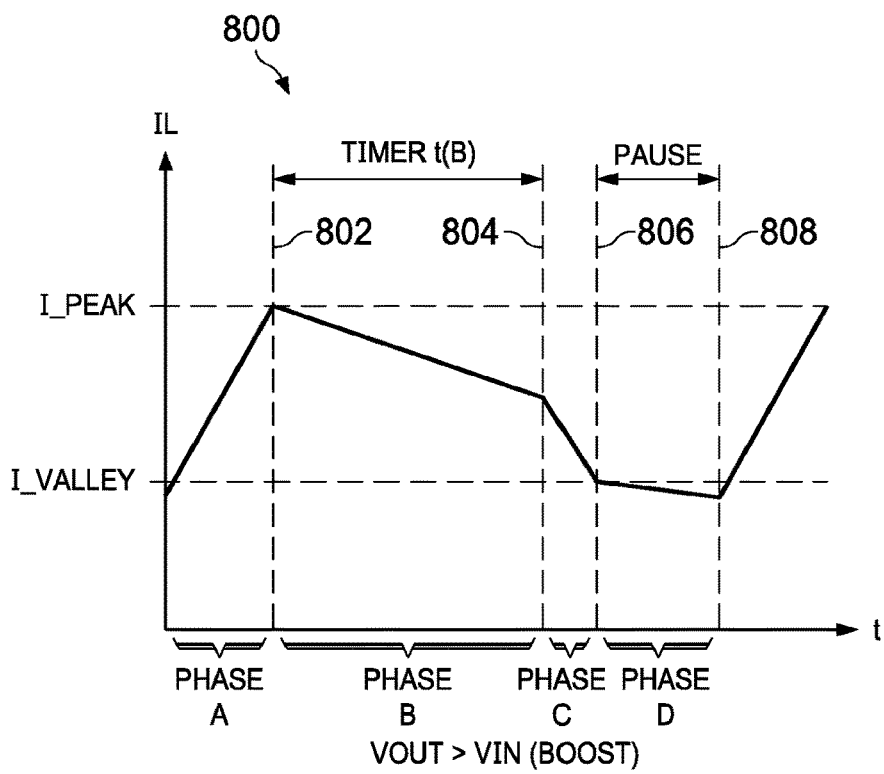
FIG. 8 shows a waveform of inductor current as a function of time for the voltage converter operating in a boost mode in accordance with various examples.

FIG. 8 shows a waveform 800 of IL as a function of time for the voltage converter 101 operating in boost mode (VOUT>VIN) in accordance with various examples. The waveform 800 begins with the state machine 120 operating in state 602 (e.g., boost-on phase) in which IL increases due to VIN being applied across the inductor 110. At time 802, IL reaches I_PEAK, which causes the state machine 120 to transition to state 604 as explained above. In this boost mode example, IL begins to decrease, due to the voltage across the inductor 110 reversing polarity (e.g., VOUT>VIN). At time 804, the timer 124 time reaches T_max as explained above, which causes the state machine 120 to transition to state 606. IL thus continues to decrease as the inductor 110 is de-energized by providing energy to the output (e.g., VOUT). At time 806, IL reaches I_VALLEY, which causes the state machine 120 to transition to state 608 as explained above. IL decreases slightly as a result of a voltage across the inductor 110, but energy is generally preserved in the voltage converter 101 (via inductor 110) from time 806 to 808. At time 808, VOUT reaches VREF, which causes the state machine 120 to transition back to state 602, and the described cycle is repeated. Although not shown in the example of FIG. 8, in some examples, IL decreases more rapidly following time 802, and thus reaches I_VALLEY prior to the timer 124 expiring. In such an example, the state machine 120 transitions directly from state 604 to state 608, as explained above.

Figure 9:
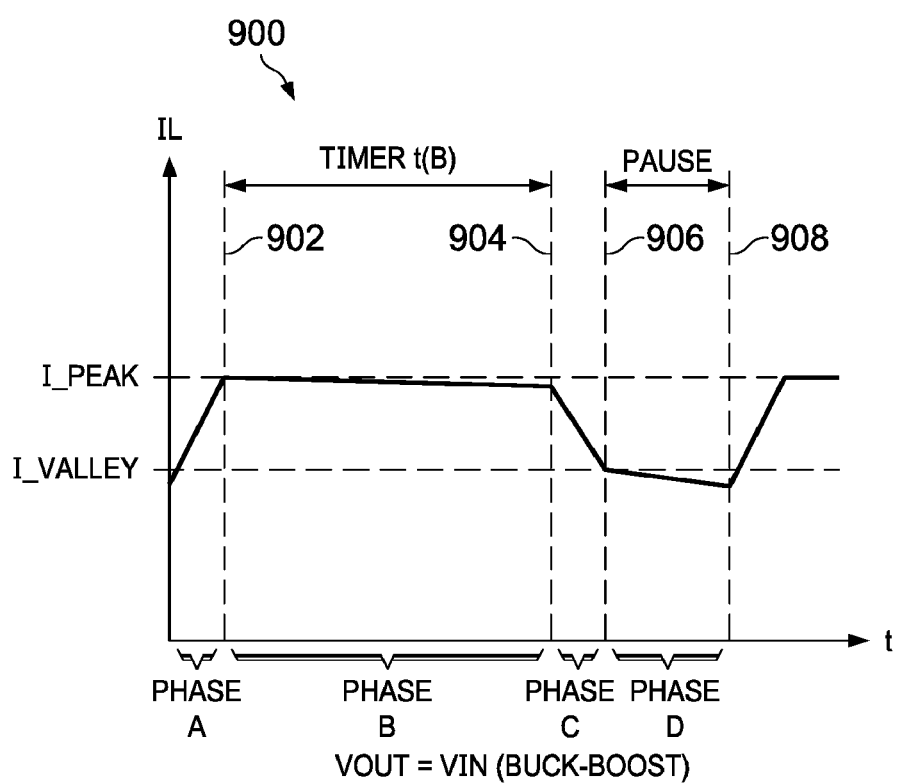
FIG. 9 shows a waveform of inductor current as a function of time for the voltage converter operating in a buck-boost mode in accordance with various examples.

FIG. 9 shows a waveform 900 of IL as a function of time for the voltage converter 101 operating in buck-boost mode (VOUT=VIN) in accordance with various examples. The waveform 900 begins with the state machine 120 operating in state 602 (e.g., boost-on phase) in which IL increases due to VIN being applied across the inductor 110. At time 902, IL reaches I_PEAK, which causes the state machine 120 to transition to state 604 as explained above. In this buck-boost mode example, IL begins to decrease relatively slowly, due to a relatively small voltage across the inductor 110, because VOUT is approximately equal to VIN. At time 904, the timer 124 time reaches T_max as explained above, which causes the state machine 120 to transition to state 606. IL thus begins to decrease more rapidly as the inductor 110 is de-energized by providing energy to the output signal (e.g., VOUT). At time 906, IL reaches I_VALLEY, which causes the state machine 120 to transition to state 608 as explained above. IL decreases slightly as a result of the inductor 110 time constant and resistive losses across the short circuit path, but energy is generally preserved in the voltage converter 101 from time 906 to 908. At time 908, VOUT reaches VREF, which causes the state machine 120 to transition back to state 602, and the described cycle is repeated. Although not shown in the example of FIG. 9, in some examples IL decreases more rapidly following time 902, and thus reaches I_VALLEY prior to the timer 124 expiring. In such an example, the state machine 120 transitions directly from state 604 to state 608, as explained above.

In addition to the controller 103 described above, which uses the state machine 120 to control the transistors 102, 104, 106, 108 of the voltage converter 101, other examples of this disclosure relate to a controller configured to regulate the conversion energy of a voltage converter. Such controllers often rely on an analog-to-digital converter (ADC) to digitize the analog value of VOUT, which is then processed by a digital signal processor (DSP) to appropriately control the conversion energy (e.g., the magnitude of I_PEAK and I_VALLEY) of the voltage converter. The use of such ADCs and DSPs is both complex and consumes a relatively large amount of power.

Figure 10:
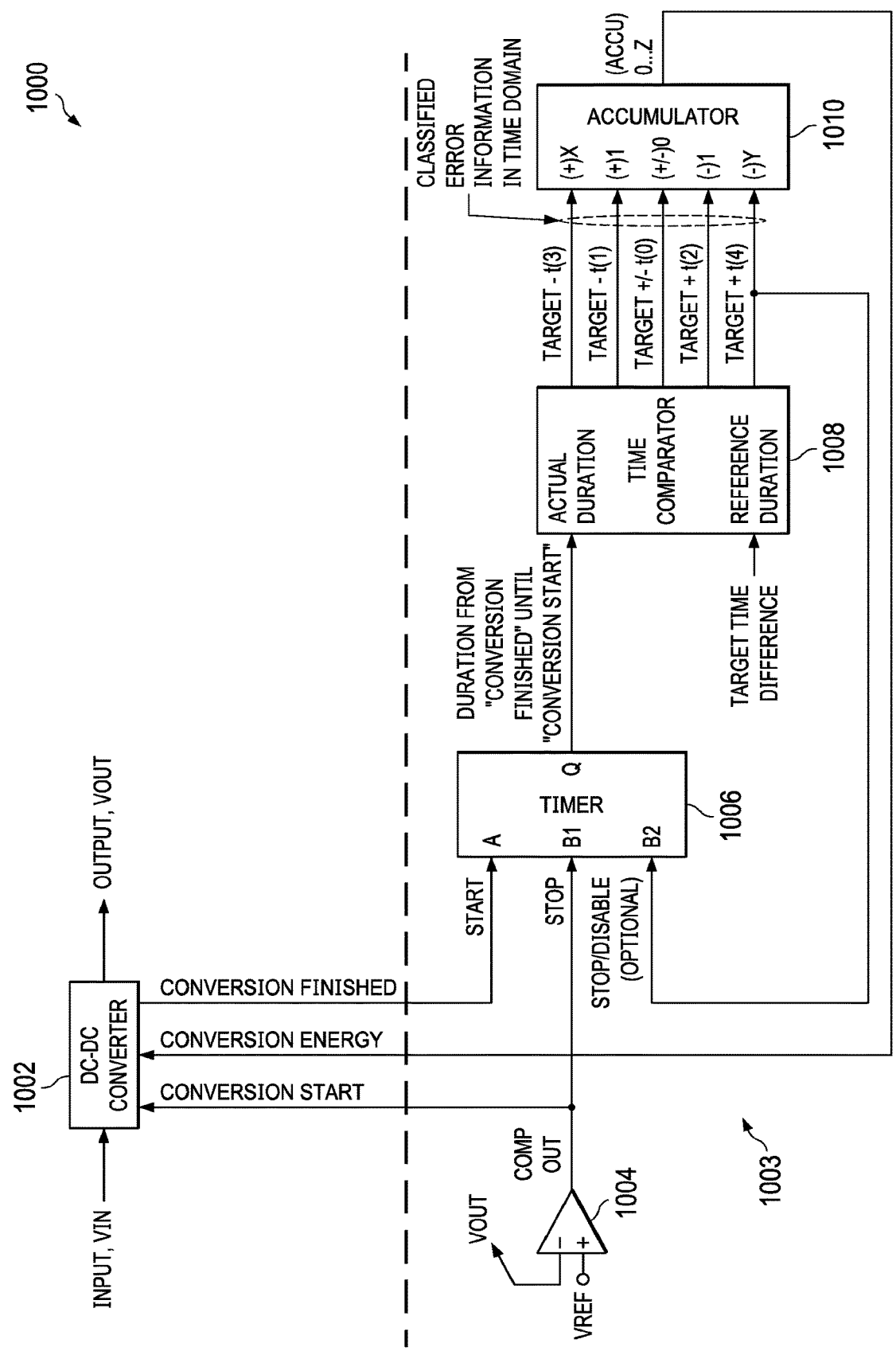
FIG. 10 shows a block diagram of a system in accordance with various examples.

FIG. 10 shows a block diagram of a system 1000 in accordance with various examples. The system 1000 includes a voltage converter 1002 and a controller 1003 coupled to the voltage converter 1002. In an example, the voltage converter 1002 is a DC-DC converter such as a buck-boost converter that converts an input voltage (VIN) at an input terminal to an output voltage (VOUT) at an output terminal. In at least some examples, the voltage converter 1002 is configured to operate in multiple modes (e.g., buck mode, boost mode, or buck-boost mode). In an example, the voltage converter 1002 is structurally similar to the voltage converter 101 descried above.

In the example of FIG. 10, the controller 1003 is configured to regulate the conversion energy of the voltage converter 1002. Conversion energy generally refers to the current level in the voltage converter 1002. For example, a greater current level results in more energy being transferred from the input signal (e.g., VIN) to the output signal (e.g., VOUT). In the particular example where the voltage converter 1002 functions according to the above-described examples, the current level of the voltage converter 1002 is affected by controlling the values of I_PEAK and/or I_VALLEY. For example, increasing the values of I_PEAK and/or I_VALLEY increases the current level of the voltage converter 1002, while decreasing the values of I_PEAK and/or I_VALLEY decreases the current level of the voltage converter 1002, as explained above.

In the example of FIG. 10, the controller 1003 includes a comparator 1004 having an inverting terminal coupled to an output terminal of the voltage converter 1002 (e.g., configured to receive VOUT) and a non-inverting terminal configured to receive a reference or threshold voltage (VREF). The comparator 1004 thus compares VOUT to VREF and asserts its output in response to VOUT being less than VREF. Referring to FIG. 6, above, VOUT being less than VREF satisfies the condition to transition from the state 608 to the state 602, which corresponds to a transition from the pause phase to the boost on phase. For the example of FIG. 10, this is referred to as the start of conversion, because the previous conversion cycle ends with the conclusion of the pause phase. In an example, the comparator 1004 and the first comparator 122 are implemented in a single component, the output of which is used by both the state machine 120 and a timer 1006 of the controller 1003, as explained further below.

The controller 1003 also includes the timer 1006 (e.g., a counter) having a start input (A) and a stop input (B1). In some examples, the timer 1006 also has a disable input (B2) that, in response to being asserted, causes the timer 1006 to turn off. The timer 1006 is configured to start timing in response to the start input being asserted and to stop timing in response to the stop input being asserted. In response to the timer 1006 stopping, the timer 1006 is configured to latch a time value (e.g., a digital counter value) as its output. The start input of the timer 1006 is coupled to the voltage converter 1002, which is asserted in response to the conclusion of the energy transfer portion of a conversion cycle of the voltage converter 1002. In the example of FIG. 6, the conclusion of the energy transfer portion of a conversion cycle occurs in response to the state machine 120 transitioning to state 608 (e.g., from either state 604 or state 606). The stop input of the timer 1006 is coupled to the output of the comparator 1004. As a result, the output of the timer 1006 corresponds to the duration of an energy preservation phase, such as the pause phase described above, of the voltage converter 1002.

The controller 1003 also includes a time comparator 1008 coupled to the timer 1006 and configured to receive the output of the timer 1006 as an input. The time comparator 1008 is configured to receive a reference time value (e.g., a digital value to which the output of the timer 1006 is compared) as a second input. The time comparator 1008 includes a plurality of outputs. At a given time, one of the outputs of the time comparator 1008 is asserted based on a relationship between the timer 1006 output and reference time values input to the time comparator 1008.

For example, a first output of the time comparator 1008 is configured to be asserted in response to the timer 1006 output being within a first deviation from the reference time value (e.g., TARGET+/−t(0)). Similarly, a second output of the time comparator 1008 is configured to be asserted in response to the timer 1006 output being more than t(0) but less than a second deviation less than the reference time value (e.g., TARGET−t(1)). Further, a third output of the time comparator 1008 is configured to be asserted in response to the timer 1006 output being more than t(0) but less than a third deviation greater than the reference time value (e.g., TARGET+t(2)). In some examples, the time comparator 1008 includes additional outputs such as a fourth output that is configured to be asserted in response to the timer 1006 output being more than t(1) less than the reference time value (e.g., TARGET−t(3)), and a fifth output that is configured to be asserted in response to the timer 1006 output being more than t(2) greater than the reference time value (e.g., TARGET+t(4)).

In this example, the time comparator 1008 effectively bins the difference between the timer 1006 output, which corresponds to the duration of an energy preservation phase, such as the pause phase described above, of the voltage converter 1002, and the reference time value, which may be determined based on the preservation of energy in the voltage converter 1002 during the pause phase. As a result, the energy delivery of the voltage converter 1002 occurs during the period of time between conversion start and conversion finished. In some examples, in order to reduce the current level, and thus the losses during the pause phase, and also to provide sufficient control headroom for a variation of the pause phase duration, the reference time value is a fraction of the period of time between conversion start and conversion finished. The combination of the timer 1006 that measures the duration of the pause phase (e.g., the time taken for VOUT to fall below VREF) and the time comparator 1008 to compare the actual duration (e.g., the timer 1006 output) with the reference time value or duration returns a degree of error. As a result, information regarding the voltage error of VOUT is transferred into the time domain.

The controller 1003 further includes an accumulator 1010. The outputs of the time comparator 1008 are provided as inputs to the accumulator 1010. Thus, the accumulator 1010 is configured to be controlled by the binned or classified error information from the time comparator 1008. The output of the accumulator 1010 is a value that controls a level of conversion energy of the voltage converter 1002. For example, an increase in the accumulator 1010 output value results in an increase to the values of I_PEAK and/or I_VALLEY. Continuing this example, a decrease in the accumulator 1010 output value results in a decrease to the values of I_PEAK and/or I_VALLEY, as explained above.

In the example of FIG. 10, the accumulator 1010 is configured to maintain its output value in response to the first output of the time comparator 1008 being asserted. As explained above, the first output of the time comparator 1008 is asserted in response to the timer 1006 output duration being within the first deviation t(0) of the reference time duration. This indicates that the conversion energy for the voltage converter 1002 (e.g., the I_PEAK and/or I_VALLEY values) is appropriate for a particular load, and the accumulator 1010 output value, and thus the conversion energy for the voltage converter 1002, is maintained.

The accumulator 1010 is configured to increase its output value in response to the second output of the time comparator 1008 being asserted. As explained above, the second output of the time comparator 1008 is asserted in response to the timer 1006 output duration being more than t(0) but less than TARGET−t(1) less than the reference time duration. This indicates that the conversion energy for the voltage converter 1002 is too low for a particular load (e.g., which results in the pause phase being shorter than expected), and the accumulator 1010 output value, and thus the conversion energy for the voltage converter 1002, is increased.

The accumulator 1010 is configured to decrease its output value in response to the third output of the time comparator 1008 being asserted. As explained above, the third output of the time comparator 1008 is asserted in response to the timer 1006 output duration being more than t(0) but less than TARGET+t(2) greater than the reference time duration. This indicates that the conversion energy for the voltage converter 1002 is too high for a particular load (e.g., which results in the pause phase being longer than expected), and the accumulator 1010 output value, and thus the conversion energy for the voltage converter 1002, is decreased.

In certain examples, the time comparator 1008 includes additional outputs, such as the fourth and fifth outputs explained above and shown in FIG. 10. In these examples, the amount by which the accumulator 1010 increases or decreases its output value may vary depending on which one of the time comparator 1008 outputs is asserted. For example, if the second output is asserted, the accumulator 1010 is configured to increase its output value by a first amount (e.g., a value of 1 in the example of FIG. 10). If the third output is asserted, the accumulator 1010 is configured to decrease its output value by a second amount (e.g., also a value of 1 in the example of FIG. 10). However, if the fourth output is asserted, this indicates a larger error value because the pause phase duration was further below the reference time value than expected (e.g., less than TARGET−t(1)). Similarly, if the fifth output is asserted, this indicates a larger error value because the pause phase duration was even greater relative to the reference time value than expected (e.g., greater than TARGET+t(2)). In some examples, the accumulator 1010 is configured to increase or decrease its output by a greater amount (e.g., +X or −Y) in response to the fourth or fifth outputs, respectively, being asserted. This allows the accumulator 1010 to more rapidly increase or decrease the conversion energy of the voltage converter 1002 as needed.

In some examples, the accumulator 1010 is configured to increase the value of X in response to the fourth output of the time comparator 1008 being asserted for multiple cycles in a row. Additionally, to further reduce power consumption of the controller 1003 in response to the voltage converter 1002 supplying a light load, the fifth output of the time comparator 1008 is also coupled to the disable input of the timer 1006. Thus, in response to the pause phase being longer than TARGET+t(2), the timer 1006 is also disabled to reduce power consumption.

In the example of FIG. 10, the controller 1003 regulates the voltage converter 1002 operation using a one-bit ADC in the form of the comparator 1004 and subsequent circuitry that operates in the time domain in response to the value output by the timer 1006. As a result, in some examples, the power consumption of the controller 1003 is less than that of a controller that uses higher precision ADCs to digitize the analog voltage value VOUT and then process the digitized voltage value in order to control the operation of a voltage converter.

Figure 11:
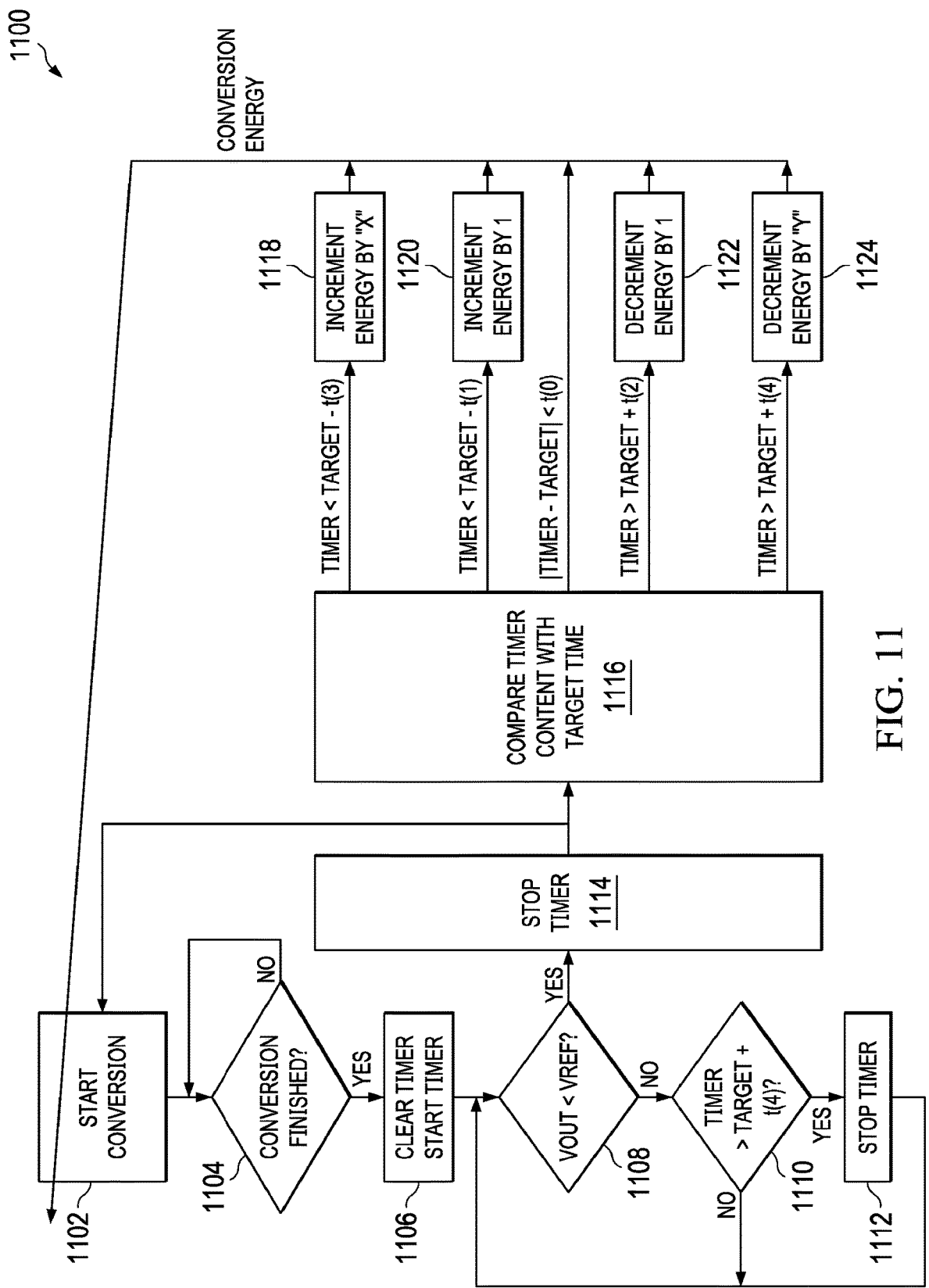
FIG. 11 shows a state diagram of operation of a controller for a voltage converter in accordance with various examples.

FIG. 11 shows a state diagram 1100 of operation of the controller 1003 shown in FIG. 10 in accordance with various examples. The state diagram 1100 includes a state 1102 in which the voltage converter 1002 begins a conversion cycle (e.g., as a result of the output of the comparator 1004 being asserted). The timer 1006 is also stopped in response to the conversion cycle beginning in the state 1102. The state diagram 1100 then transitions to and remains in state 1104 until the energy transfer portion of the conversion cycle is finished, for example as indicated by the voltage converter 1002.

In response to the voltage converter 1002 asserting that the energy transfer portion of the conversion cycle is finished, the state diagram 1100 transitions to the state 1106, in which the timer 1006 is cleared and started. As explained above, the start input of the timer 1006 is coupled to an output of the voltage converter 1002 that is asserted in response to the energy transfer portion of the conversion cycle being finished.

After the timer 1006 is started in the state 1106, the state diagram 1100 proceeds to state 1108 where it is determined whether VOUT is less than VREF (e.g., by the comparator 1004). While VOUT is greater than VREF, the state diagram 1100 proceeds to block 1110 where it is determined whether the timer 1006 value is greater than a third deviation (e.g., t(4)) greater than a reference time value (e.g., TARGET). While the timer 1006 value is less than TARGET+t(4), the state diagram 1100 returns to the state 1108. However, if the timer 1006 value is greater than TARGET+t(4), the state diagram 1100 continues to the state 1112 in which the timer 1006 is stopped or disabled (e.g., to save power as explained above), at which point the state diagram 1100 also returns to the state 1108 to determine when VOUT is less than VREF.

From the state 1108, in response to VOUT being less than VREF (e.g., indicated by the comparator 1004 output), the state diagram 1100 continues to the state 1114 where the timer 1006 is stopped. The state diagram 1100 then continues to the state 1116 in which the time value output by the timer 1006 is compared with various thresholds. As explained above, if the timer 1006 output is within a first deviation from the reference time value (e.g., TARGET+/− t(0)), conversion energy (e.g., the values of I_PEAK and/or I_VALLEY) is maintained and thus the state diagram 1100 returns to the state 1102 and a new conversion cycle begins.

Referring back to the state 1116, if the timer 1006 output is more than t(0) but less than a second deviation less than the reference time value (e.g., TARGET−t(1)), the state diagram 1100 proceeds to the state 1120 in which the conversion energy of the voltage converter 1002 is increased by a first amount (e.g., 1). The state diagram 1100 then returns to the state 1102 and a new conversion cycle begins, in which the values of I_PEAK and/or I_VALLEY are increased relative to their previous values.

Referring back to the state 1116, if the timer 1006 output is more than t(0) but less than a third deviation greater than the reference time value (e.g., TARGET+t(2)), the state diagram 1100 proceeds to the state 1122 in which the conversion energy of the voltage converter 1002 is decreased by a second amount (e.g., 1). The state diagram 1100 then returns to the state 1102 and a new conversion cycle begins, in which the values of I_PEAK and/or I_VALLEY are decreased relative to their previous values.

Referring back to the state 1116, if the timer 1006 output is more than t(1) less than the reference time value (e.g., TARGET−t(3)), the state diagram 1100 proceeds to the state 1118 in which the conversion energy of the voltage converter 1002 is increased by a fourth amount (e.g., X). The state diagram 1100 then returns to the state 1102 and a new conversion cycle begins, in which the values of I_PEAK and/or I_VALLEY are further increased (e.g., X>1) relative to their previous values.

Again referring back to the state 1116, if the timer 1006 output is more than t(2) greater than the reference time value (e.g., TARGET+t(4)), the state diagram 1100 proceeds to the state 1124 in which the conversion energy of the voltage converter 1002 is decreased by a fifth amount (e.g., Y). The state diagram 1100 then returns to the state 1102 and a new conversion cycle begins, in which the values of I_PEAK and/or I_VALLEY are further decreased (e.g., Y>1) relative to their previous values.

As explained above, the state diagram 1100 provides a method to regulate the voltage converter 1002 operation using a one-bit ADC in the form of the comparator 1004 and subsequent circuitry that operates in the time domain in response to the value output by the timer 1006. As a result, in some examples, the power consumption of the controller 1003 that implements the state diagram 1100 is less than that of a controller that uses higher precision ADCs to digitize the analog voltage value VOUT and then process the digitized voltage value in order to control the operation of a voltage converter.

Figure 12:
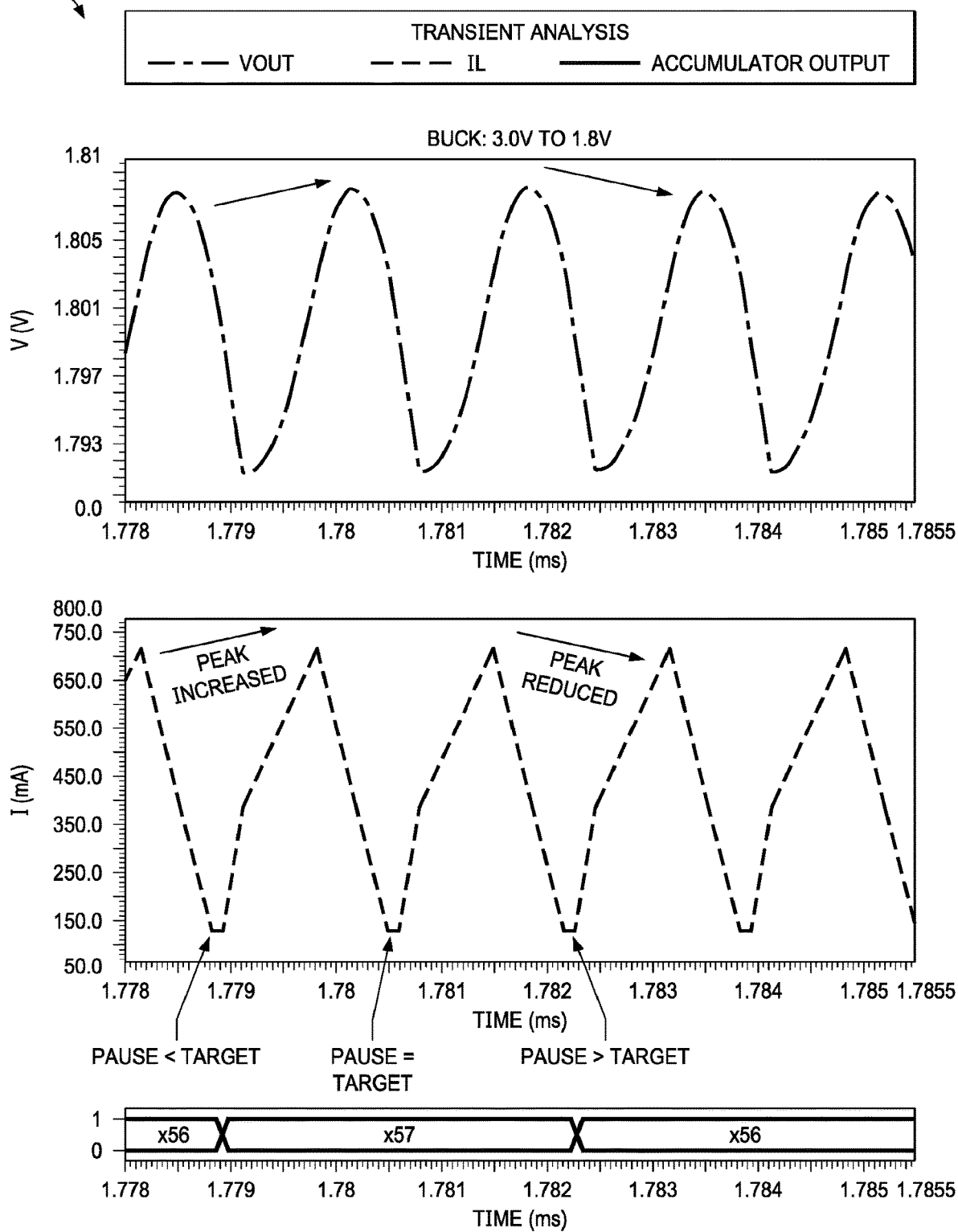
FIG. 12 shows a waveform of output voltage and inductor current as a function of time for the voltage converter operating in the buck mode in accordance with various examples.

FIG. 12 shows waveforms 1200 of VOUT, inductor current (IL), and accumulator 1010 output as a function of time for the voltage converter 101, 1002 operating in the buck mode in accordance with various examples. In particular, in response to determining that the pause phase is shorter than the reference time value (PAUSE<TARGET), the accumulator 1010 output is increased from a value of 0x56 to a value of 0x57. As a result, the conversion energy of the voltage converter 101, 1002 is increased by increasing the value of I_PEAK. Subsequently, in response to determining that the pause phase is within a first deviation of the reference time value (PAUSE=TARGET), the accumulator 1010 output is maintained at a value of 0x57. Finally, in response to determining that the pause phase is longer than the reference time value (PAUSE>TARGET), the accumulator 1010 output is decreased from 0x57 back to 0x56. The foregoing is one example and it is noted that such regulation continues, with varying changes to the accumulator 1010 output as described above with respect to FIGS. 10 and 11.

Figure 13:
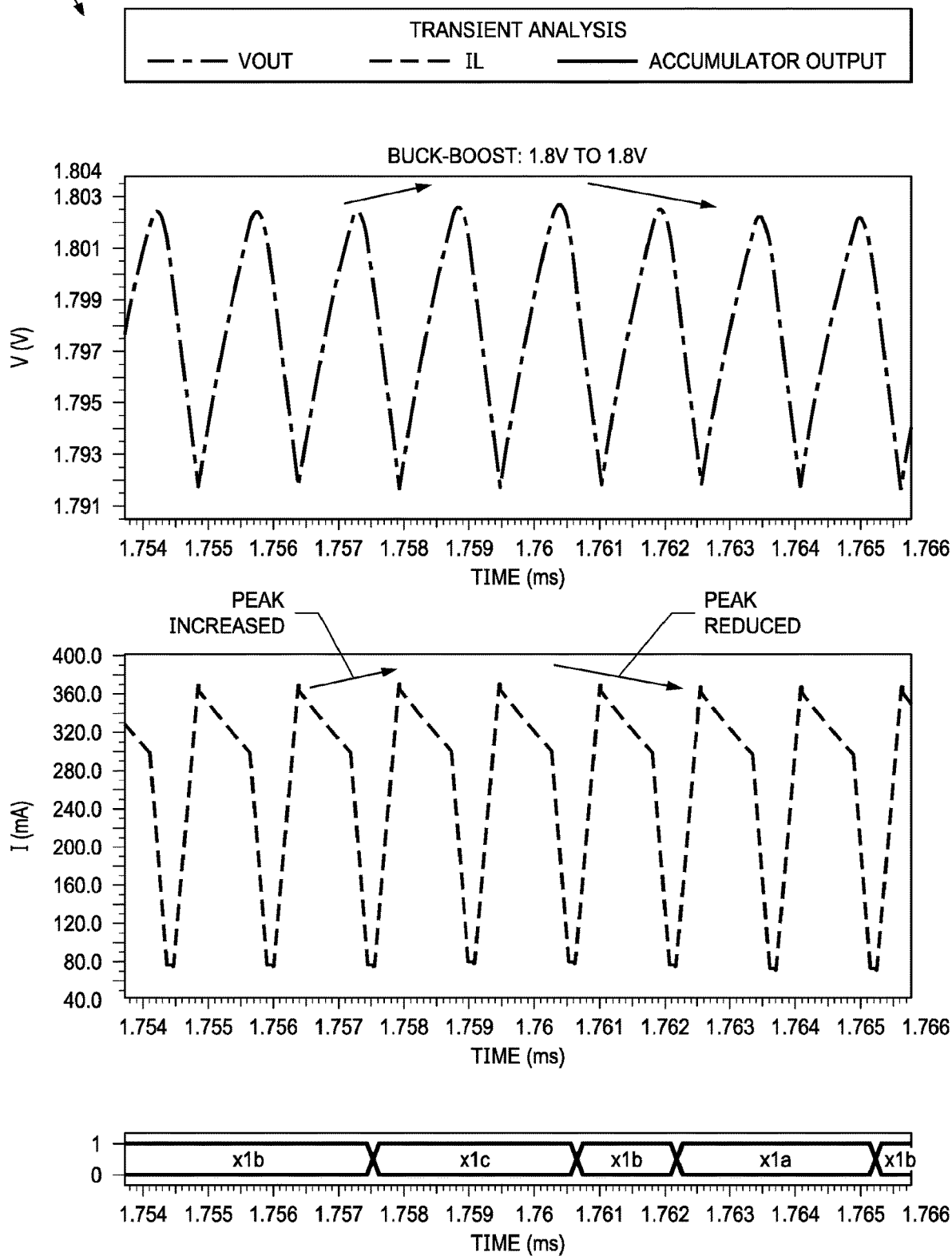
FIG. 13 shows a waveform of output voltage and inductor current as a function of time for the voltage converter operating in the buck-boost mode in accordance with various examples.

FIG. 13 shows waveforms 1300 of VOUT, IL, and accumulator 1010 output as a function of time for the voltage converter 101, 1002 operating in the buck-boost mode in accordance with various examples. The waveforms 1300 are generally similar to the waveforms 1200 described above. For example, in response to determining that the pause phase is shorter than the reference time value, the accumulator 1010 output is increased from a value of 0x1b to a value of 0x1c. As a result, the conversion energy of the voltage converter 101, 1002 is increased by increasing the value of I_PEAK. Subsequently, in response to determining that the pause phase is longer than the reference time value, the accumulator 1010 output is decreased from 0x1c back to 0x1b. During the next cycle, in response to determining that the pause phase is still longer than the reference time value (e.g., decreasing the accumulator 1010 output by 1 was insufficient to shorten the pause phase to the desired duration), the accumulator 1010 output is decreased further to 0x1a. As a result, the conversion energy of the voltage converter 101, 1002 is decreased by decreasing the value of I_PEAK correspondingly with the decrease of the accumulator 1010 output. The foregoing is one example and it is noted that such regulation continues, with varying changes to the accumulator 1010 output as described above with respect to FIGS. 10 and 11.

Figure 14:
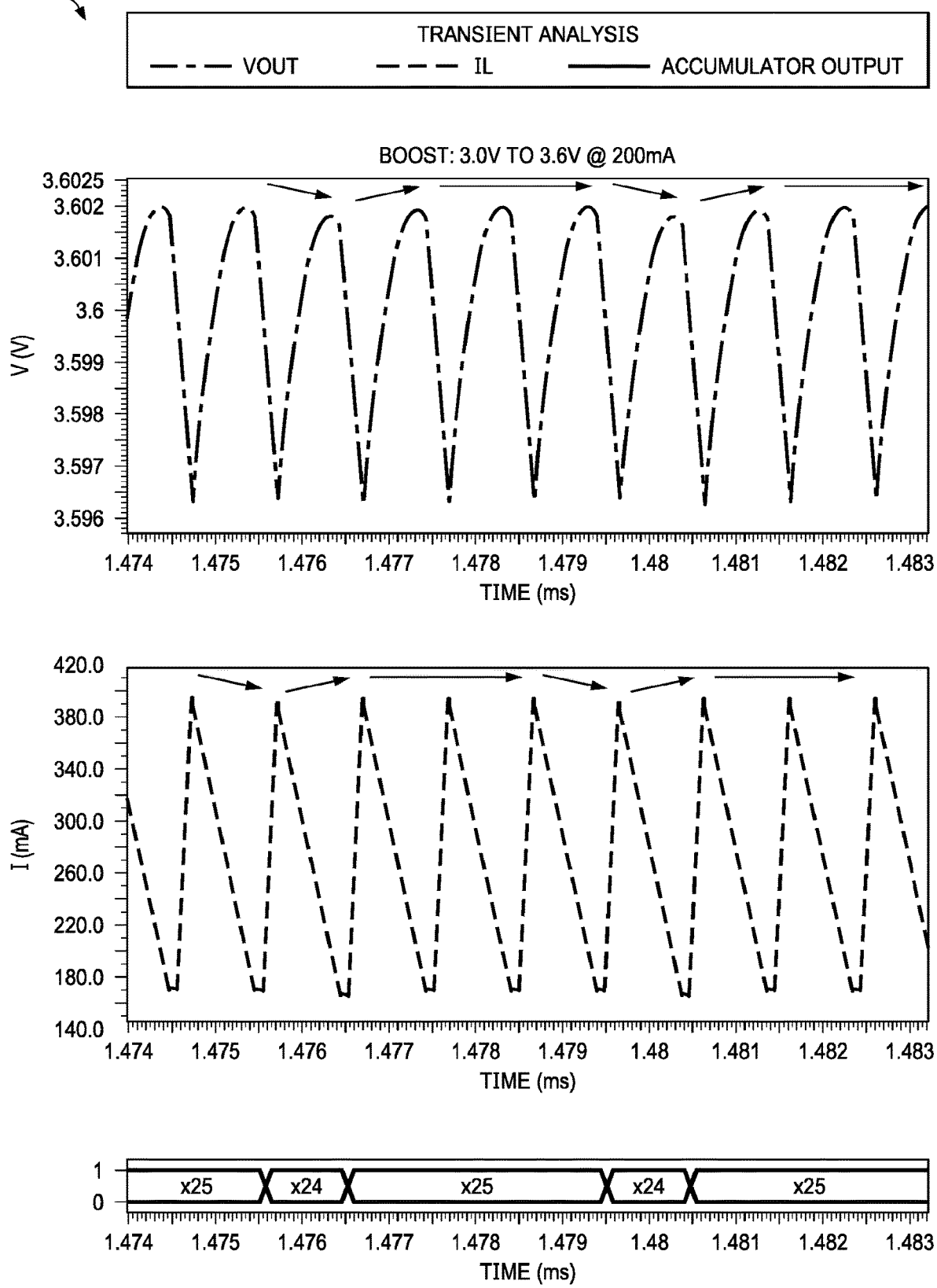
FIG. 14 shows a waveform of output voltage and inductor current as a function of time for the voltage converter operating in the boost mode in accordance with various examples.

FIG. 14 shows waveforms 1400 of VOUT, IL, and accumulator 1010 output as a function of time for the voltage converter 101, 1002 operating in the boost mode in accordance with various examples. The waveforms 1400 are generally similar to the waveforms 1200, 1300 described above. For example, in response to determining that the pause phase is longer than the reference time value, the accumulator 1010 output is decreased from a value of 0x25 to a value of 0x24. As a result, the conversion energy of the voltage converter 101, 1002 is decreased by decreasing the value of I_PEAK. Subsequently, in response to determining that the pause phase is shorter than the reference time value, the accumulator 1010 output is increased from 0x24 back to 0x25. This behavior continues to regulate the length of the pause phase. The foregoing is one example and it is noted that such regulation continues, with varying changes to the accumulator 1010 output as described above with respect to FIGS. 10 and 11.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

What is claimed is:

1. A controller comprising:
   a timer having first, second and third timer inputs and a timer output, wherein the first timer input is coupled to an input terminal, the second timer input is coupled to an output terminal;
   a first comparator having a first comparator output and first and second comparator inputs, wherein the first comparator input is coupled to the output terminal, and the second comparator input is coupled to a reference voltage terminal;
   a logic circuit having first and second logic inputs and first, second, and third logic outputs, wherein the first logic input is coupled to the timer output, the second logic input is coupled to the first comparator output, and the third logic output is coupled to the third timer input, wherein the logic circuit is configurable to provide a signal at the third logic output to trigger the timer to begin timing;
   a first driver having a first driver input and first and second driver outputs, wherein the first driver input is coupled to the first logic output; and
   a second driver having a second driver input and third and fourth driver outputs, wherein the second driver input is coupled to the second logic output;
   an inductor having first and second inductor terminals;
   a first transistor coupled between the input terminal and the first inductor terminal, and having a first control terminal coupled to the first driver output;
   a second transistor coupled between the first inductor terminal and a ground terminal, and having a second control terminal coupled to the second driver output;
   a third transistor coupled between the second inductor terminal and the output terminal, and having a third control terminal coupled to the third driver output; and
   a fourth transistor coupled between the second inductor terminal and the ground terminal, and having a fourth control terminal coupled to the fourth driver output;
   a second comparator having a second comparator output and third and fourth comparator inputs, wherein the third comparator input is coupled to the first inductor terminal, the fourth comparator input is coupled to a second reference voltage terminal, and a voltage at the first inductor terminal is proportional to a current through the inductor;
   wherein the controller is configured to cause a system to operate in a first state, a second state, a third state, and a fourth state, in which:
      the first and fourth transistors are turned on during the first state, and the second and third transistors are turned off during the first state;
      the first and third transistors are turned on during the second state, and the second and fourth transistors are turned off during the second state;
      the logic circuit transitions to the second state responsive to the current through the inductor being greater than a first current threshold;
      the logic circuit transitions to the third state responsive to the current through the inductor being less than a second current threshold, in which the second current threshold is lower than the first current threshold; and
      the second and fourth transistors are turned on during the third state, the first and third transistors are turned off during the third state, and the system remains in the third state until a voltage at the output terminal falls below a first threshold voltage; and
      the second and third transistors are turned on during the fourth state, and the first and fourth transistors are turned off during the fourth state.

2. The controller of claim 1, wherein the controller is configured to operate the system in the fourth state directly after the second state and directly before the third state.

3. The controller of claim 1, wherein the logic circuit transitions from the second state to the fourth state after a certain duration operating in the second state.

4. The system of claim 3, wherein the certain duration is a constant time value.

5. The system of claim 1, wherein the controller controls a voltage converter in a buck mode.

6. The system of claim 1, wherein the controller controls a voltage converter in a boost mode or a buck-boost mode.

7. The system of claim 3, wherein the certain duration is set responsive to a voltage at the input terminal and the voltage at the output terminal.

\* \* \* \* \*